US008614842B2

(12) United States Patent
Aspnes et al.

(10) Patent No.: US 8,614,842 B2
(45) Date of Patent: Dec. 24, 2013

(54) VOLUME HOLOGRAM REPLICATOR FOR TRANSMISSION TYPE GRATINGS

(71) Applicant: Prism Solar Technologies Incorporated, Highland, NY (US)

(72) Inventors: Eric D. Aspnes, Tucson, AZ (US); Jose E. Castillo, Tucson, AZ (US); Ryan D. Courreges, Tucson, AZ (US); Paul S. Hauser, Tucson, AZ (US); Glenn Rosenberg, Tucson, AZ (US); Juan Manuel Russo, Tucson, AZ (US)

(73) Assignee: Prism Solar Technologies Incorporated NY (US)

( * ) Notice: Subject to any disclaimer, the term of this patent is extended or adjusted under 35 U.S.C. 154(b) by 0 days.

(21) Appl. No.: 13/675,873

(22) Filed: Nov. 13, 2012

(65) Prior Publication Data

US 2013/0120815 A1    May 16, 2013

Related U.S. Application Data

(60) Provisional application No. 61/560,381, filed on Nov. 16, 2011, provisional application No. 61/562,654, filed on Nov. 22, 2011, provisional application No. 61/559,425, filed on Nov. 14, 2011, provisional application No. 61/559,980, filed on Nov. 15, 2011.

(51) Int. Cl.
    *G03H 1/20* (2006.01)
(52) U.S. Cl.
    USPC .................................................. 359/12; 430/2
(58) Field of Classification Search
    USPC ...................... 359/12, 25, 26; 430/2
    See application file for complete search history.

(56) References Cited

U.S. PATENT DOCUMENTS

| | | | |
|---|---|---|---|
| 4,575,192 A | 3/1986 | Duthie et al. | |
| 4,953,923 A | 9/1990 | Wreede | |
| 5,504,593 A * | 4/1996 | Hotta et al. | 359/1 |
| 5,843,598 A * | 12/1998 | Ueda et al. | 430/2 |
| 6,262,819 B1 | 7/2001 | Shirakura et al. | |
| 6,274,860 B1 | 8/2001 | Rosenberg | |
| 6,597,475 B1 * | 7/2003 | Shirakura et al. | 359/12 |
| 6,661,548 B2 | 12/2003 | Klug et al. | |
| 2002/0051419 A1 | 5/2002 | Itoh et al. | |
| 2004/0123895 A1 | 7/2004 | Kardauskas et al. | |
| 2006/0272698 A1 | 12/2006 | Durvasula | |
| 2007/0229927 A1 | 10/2007 | Iriguchi | |
| 2009/0032087 A1 | 2/2009 | Kalejs | |
| 2009/0255568 A1 | 10/2009 | Morgan | |
| 2010/0067076 A1 * | 3/2010 | Brotherton-Ratcliffe | 359/12 |

(Continued)

OTHER PUBLICATIONS

Authorized Officer Blaine R. Copenheaver, International Search Report and Written Opinion in PCT/US2012/064984; 7 pages; mailed Jan. 28, 2013.

(Continued)

*Primary Examiner* — Alessandro Amari
(74) *Attorney, Agent, or Firm* — Yakov Sidorin; Quarles & Brady LLP

(57) ABSTRACT

A holographic replicator configured to mass-manufacture volumetric transmission holograms and including an imaging tank having a holographic master plate opposing a pneumatic absorber. When a segment of a recording film, moveable with respect to the master plate, is placed between the master plate and the pneumatic absorber, the pneumatic absorber is repositioned in space to locks the segment of the recording film between the master plate and the pneumatic absorber.

11 Claims, 6 Drawing Sheets

(56) References Cited

U.S. PATENT DOCUMENTS

| | | |
|---|---|---|
| 2010/0195175 A1* | 8/2010 | Flynn et al. .................. 359/2 |
| 2010/0200063 A1 | 8/2010 | Djeu |
| 2010/0218805 A1 | 9/2010 | Everett et al. |
| 2010/0243024 A1 | 9/2010 | Hashimoto et al. |
| 2011/0120222 A1 | 5/2011 | Scholte et al. |
| 2011/0132423 A1 | 6/2011 | Jose et al. |

OTHER PUBLICATIONS

PCT/US2012/064984, Nov. 14, 2012, Volume Hologram explicator for Transmission Type Gratings, Aspnes et al.

International Search Report and Written Opinion in PCT/US2012/066071; 8 pages mailed Feb. 7, 2013.

International Search Report and Written Opinion in PCT/US2012/064989; 9 pages mailed Jan. 28, 2013.

* cited by examiner

VOLUME HOLOGRAM REPLICATOR FOR TRANSMISSION TYPE GRATINGS

CROSS-REFERENCE TO RELATED APPLICATIONS

The present application claims benefit of and priority from the U.S. Provisional Applications Nos. 61/560,381 filed on Nov. 16, 2011 and titled "Volume Hologram Replicator for Transmission Type Gratings"; 61/562,654 filed on Nov. 22, 2011 and titled "Linear Scan Modification to Step and Repeat Holographic Replicator"; 61/559,425 filed on Nov. 14, 2011 and titled "Advanced Bussing Options for Equal Efficiency Bifacial Cells"; and 61/559,980 filed on Nov. 15, 2011 and titled "Flexible Crystalline PV Module Configurations. The disclosure of each of the above-mentioned provisional patent applications is incorporated herein by reference in its entirety for all purposes.

TECHNICAL FIELD

The present invention relates to a method and system for replicating holograms and more specifically, for mass manufacturing of volumetric, transmission holograms (in particular with line illumination sources).

BACKGROUND OF THE INVENTION

Solar energy will satisfy an important part of future energy needs. While the need in solar energy output has grown dramatically in recent years, the total output from all solar installations worldwide still remains around 7 gigawatts, which is only a tiny fraction of the world's energy requirement. High material and manufacturing costs, low solar module efficiency, and shortage of refined silicon limit the scale of solar power development required to effectively compete with the use of coal and liquid fossil fuels.

The key issue currently faced by the solar industry is how to reduce system cost. The main-stream technologies that are being explored to improve the cost-per-kilowatt of solar power are directed to (i) improving the efficiency of solar cells that comprise solar modules, and (ii) delivering greater amounts of solar radiation onto the solar cell. In particular, these technologies include developing thin-film, polymer, and dye-sensitized photovoltaic (PV) cells to replace expensive semiconductor material based solar cells, the use of high-efficiency smaller-area photovoltaic devices, and implementation of low-cost collectors and concentrators of solar energy.

While the reduction of use of semiconductor-based solar cells is showing great promise, for example, in central power station applications, it remains disadvantageous for residential applications due to the form factor and significantly higher initial costs. Indeed, today's residential solar arrays are typically fabricated with silicon photovoltaic cells, and the silicon material constitutes the major cost of the module. Therefore techniques that can reduce the amount of silicon used in the module without reducing output power will lower the cost of the modules.

The use of devices adapted to concentrate solar radiation on a solar cell is one such technique. Various light concentrators have been disclosed in related art, for example a compound parabolic concentrator (CPC); a planar concentrator such as, for example, a holographic planar concentrator (HPC) including a planar highly transparent plate and a holographically-recorded optical element mounted on its surface; and a spectrum-splitting concentrator (SSC) that includes multiple, single junction PV cells that are separately optimized for high efficiency operation in respectively-corresponding distinct spectral bands. A conventionally-used HPC is deficient in that the collection angle, within which the incident solar light is diffracted to illuminate the solar cell, is limited to about 45 degrees. Production of a typical SSC, on the other hand, requires the use of complex fabrication techniques.

Volume holographic diffraction gratings have shown to be viable products for solar concentration. The gratings take the incoming light and bend the light to specific angles, based on the specific wavelength of light. With the appropriate grating and module configuration, the light that hits the grating is bent towards the PV material, increasing the amount of light it would see otherwise.

However, the production of volume holograms, especially those in the transmission configuration, is a time consuming process with low repeatability. Specifically, holograms are typically copied by positioning holographic recording film adjacent to a master holographic plate. The master hologram is then illuminated with a coherent reference beam, resulting in a replication of the curvature, direction, and wavelength of the original reference beam used to create the master hologram, which in turn creates a replica of the master hologram on the recording film. During this process, it is critical that the film and master holographic plate are fixed in place as any relative movement will corrupt the reproduction. Due to this limitation, current techniques require that significant time be expended stabilizing the system, which limits the rate at which the holograms can be replicated. Because the laser used to illuminate the master hologram is running the entire time and because it has a limited number of hours of continuous operation before it needs to be replaced or reworked, the stabilization time limits the amount of holographic film a laser can produce in its lifetime. Therefore a method and system is needed which allows for volume holograms, which are suitable for solar applications, to be mass produced in a cost-effective manner and which maximizes the productivity of the laser.

SUMMARY OF THE INVENTION

An approach is disclosed that improves and simplifies known systems and methods for the production of holograms. Embodiments of the invention present a hologram replicator that includes an optically transparent plate; a recording film enabled to advance with respect to the holographic plate; and a light absorber actuatable to move such as to press the recording film against the optically transparent plate to lock the film between the absorber and the optically transparent plate. The optically transparent plate optionally includes a holographic master plate configured to form a diffracted beam from an incident beam of light traversing the holographic master plate. A replicator may further comprise a light source configured to generate a light beam having a substantially linear cross-section that is directed to impinge onto the recording film through the optically transparent plate. A replicator may further include a beam-expansion optical element, wherein when a beam from the laser source passes through the beam-expansion optical element, such transmitted beam is expanded only in one dimension. The substantially linear cross-section of such beam has first and second dimensions a ratio of which, as measured in two directions that are substantially perpendicular to one another, is at least 10. In a related embodiment, the replicator may additionally include a volume of index-matching liquid submerging the optically transparent plate, the recording film, and the light absorber, and a means for pulling the recording film through this volume such as to reposition the film with respect to the optically transparent plate.

Additionally or in the alternative, the replicator may include a processor; and a computer readable tangible non-transitory medium comprising a computer-readable program code such that, when the code is executed by the processor, the code causes the processor to change a relative positioning of the optically transparent plate and the light absorber such as to lock the recording film therebetween.

Embodiments of the invention further provide a method for replicating a hologram. The method includes (i) locking a recording film, enabled to be moved with respect to an optically transparent plate, between the optically transparent plate and a light absorber; and (ii) receiving a reference beam of light and an information beam of light from the optically transparent plate at the recording film, each of the beams of light having a corresponding cross-section with a first dimension that is at least an order of magnitude larger than a second dimension, where the first and second dimensions are measured the said cross-section in two substantially orthogonal directions. The method further includes (iii) unlocking the recording film to enable an advancement of the film with respect to the optically transparent plate. The step of locking may include changing mutual positioning of the optically transparent plate and the light absorber, while the step of receiving may include transmitting the reference and information beams of light through the optically transparent plate. Optionally, the step of receiving includes forming an information beam of light at the optically transparent plate by transmitting the reference beam through the optically transparent plate towards the recording film. Optionally, the step of locking includes locking a recording film submerged in an index matching fluid. The method further includes expanding a beam from the source of light substantially only in one dimension and scanning the optically transparent plate with the expanded beam.

DETAILED DESCRIPTION

Figure 1:
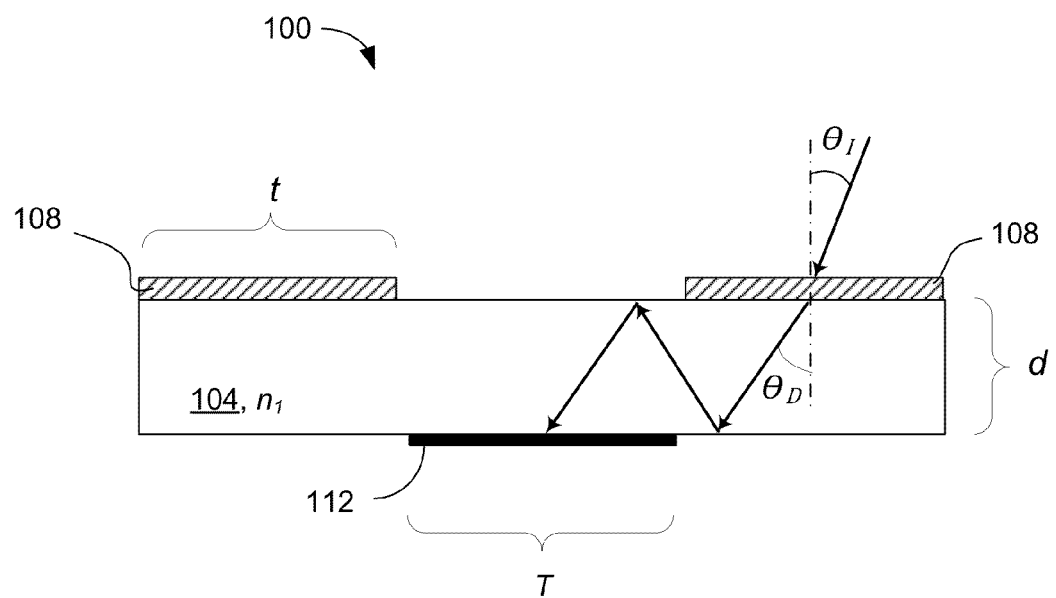
FIG. 1 is a schematic of a holographic planar concentrator.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

In addition, the following disclosure may describe features of the invention with reference to corresponding drawings, in which like numbers represent the same or similar elements wherever possible. In the drawings, the depicted structural elements are generally not to scale, and certain components are enlarged relative to the other components for purposes of emphasis and understanding. It is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

Moreover, if the schematic flow chart diagram is included, it is generally set forth as a logical flow-chart diagram. As such, the depicted order and labeled steps of the logical flow are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow-chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Without loss of generality, the order in which processing steps or particular methods occur may or may not strictly adhere to the order of the corresponding steps shown.

The invention as recited in claims appended to this disclosure is intended to be assessed in light of the disclosure as a whole, including features disclosed in prior art to which reference is made.

An HPC 100, shown schematically in a cross-sectional view in FIG. 1, typically includes a highly-transparent planar substrate 104 of thickness d (such as, for example, substrate made of glass or appropriate polymeric material having the refractive index $n_1$) at least one diffractive structure 108, having width t, at a surface of the substrate 104. Such diffractive structure may include, for example, a holographic optical film (such as gelatin-on-PET film stack) in which a plurality of multiplexed diffraction gratings have been recorded with the use of laser light. The diffractive structure 108 can be optionally capped with a protective cover layer (not shown). The substrate 104 is typically cooperated with a solar-energy-collecting device 112 such as a PV cell. The diffractive structures 108 diffract wavelengths usable by the PV cell 112, while allowing the light at unusable wavelength to pass through, substantially unabsorbed. The usable energy is guided via the total internal reflection at the glass/air or glass/cover interface to strings of solar cells, resulting in up to a 3× concentration of solar energy per unit area of PV material.

As shown in FIG. 1, the PV cell 112 of width T is juxtaposed with the second surface of the substrate 104 in opposition to the diffractive structures 108 and in such orientation that ambient (sun-) light I, incident onto the structure 108 at an angle $\theta_I$, is diffracted at an angle $\theta_D$ onto the cell 112 either directly or upon multiple reflections within the substrate 104. To estimate the range of incident angles that would produce the diffracted light intersecting the surface of the PV cell 112 for different parameters of the HPC 100, such as substrate thickness, the displacement of the PV cell 112 with respect to the edge of the grating 108, or other geometrical parameters, one can use the grating equation. For example, for a glass substrate 104 and when t=T=d, the range of incident angles (the collection angle) at which the cell 112 is illuminated is about 45 degrees. When t=2T=2d, the collection angle is reduced to about 38 degrees. The angular range within which the corresponding diffracted light is produced is about 10° to 15° for most of the wavelengths. However, the angle-wavelength matching can be used to extend this range for different portions of the available spectral bandwidth of the HPC 100.

Figure 2A:
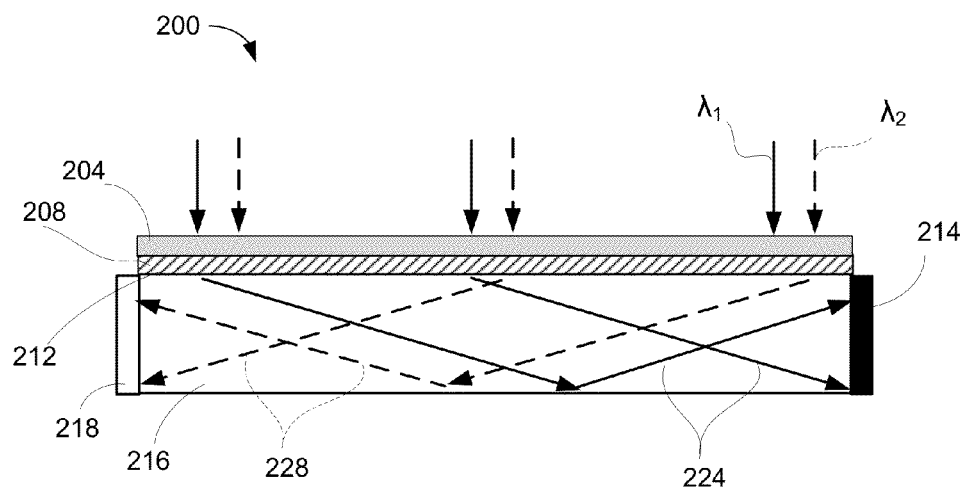
FIG. 2A shows an embodiment of a holographic spectrum-splitting device.
Figure 2B:
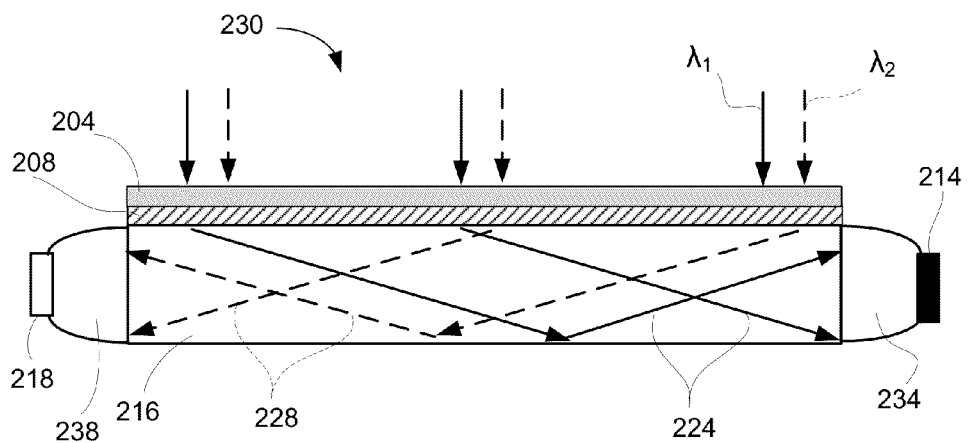
FIG. 2B shows an alternative embodiment of a holographic spectrum-splitting device.

The increase in PV-conversion efficiency, in comparison with a use of a conventional PV-cell, is also achieved by using multiple junction cells that create electron-hole pairs at the expense of energy of incident light over a wider spectral range than a single junction cell. The use of holographic grating with such spectrum-splitting devices (SSD) also offers some advantages. The hologram can be designed to diffract light within a specific spectral band in a desired direction (for example, towards one PV-cell) and be multiplexed with another hologram that diffracts light of different wavelength in another direction (for example, towards another PV-cell). One example of such holographic SSD 200, shown in FIG. 2A, includes two holographically-recorded diffractive structures 204 and 208 that are cascaded at a surface 212 of the substrate 216 (i.e., at the input of the SSD 200) and that diffract light of different wavelengths. For example, the upper hologram 204 diffracts light at wavelength $\lambda_1$ longer than wavelength $\lambda_2$ diffracted by the hologram 208. A long-wavelength PV cell 214, corresponding to hologram 204, and a short-wavelength PV cell 218, corresponding to hologram 208, are positioned transversely with respect to the holograms 204, 208 (as shown, at side facets of the substrate 216). Directionally-diffracted towards target PV cells, light 224, 228 reaches the PV cells via reflections off the surfaces of the substrate 216. A simple light-concentrating reflector can additionally be used. A similar SSD 230, upgraded with cylindrical parabolic reflectors 234, 238 that guide the diffracted light towards target PV cells, is depicted in FIG. 2B. In both cases, the collection angle is determined by geometry of the system and the diffraction characteristics of the holograms.

The present invention is directed to a method and system of mass replication of holographs using a coherent light source that has been expanded to a line. Specifically, embodiments of the invention utilize a beam, from a laser source, that has been expanded along one axis and then re-collimated so that the cross-section of such beam is extremely narrow and can be approximated by a stripe or line, thereby forming a line source of light or line illumination source. In certain embodiments, such stripe or line of light is about 1 mm by about 30 mm in size. For the purposes of this disclosure, the terms "about" and "approximately" refer to a value within a band of ±10% centered around the specified value. As is explained in greater detail, the use of a line source greatly reduces the necessary exposure time per unit area as the power density of Applicants' line source is higher than that of a conventionally used beam having a substantially two-dimensional (not a line) cross-section.

The described novel system includes a holographic replicator that contains such a line source and that forms holographs configured for various uses (such as, but not limited to, the use as diffraction gratings in low level solar concentrators, holographic data storage elements, holographically defined refractive elements such as lenses and other beam-shaping and/or gating holograms, holograms defining image of a target object). More specifically, embodiments of the system can be used to mass-replicate transmission-type holograms onto flexible substrates. In certain embodiments the recording flexible substrate includes a 35 mm film (optionally containing dichromated gelatin).

Holographic replicators commonly employ coherent light sources producing substantially collimated light output such as, for example, laser sources emitting a polarized substantially monochromatic light wave the phase of which is correlated over a relatively large distance along the direction of beam propagation.

In a typical holographic replicator, coherent light is emitted from a laser source and is then collimated with an optical element, such as a lens, to produce the original beam. In an embodiment of the described system, the collimated original beam is further transmitted through an optical element, such as, and without limitation, a cylindrical lens that expands the beam in a single chosen dimension. The so-expanded beam is further transmitted through a second optical element to re-collimate the beam and to produce a resulting beam having a line-like cross-sectional profile, as described above. Such resulting beam can be scanned across the holographic master plate to produce replica holograms on the recording film.

As the beam is expanded in only one direction, the size of the original beam is related to the size of the final line-shaped beam. Thus, for example, if the cross-sectional dimension of the original beam is on the order of a millimeter, the resulting (line-) beam maintains this dimension in one direction of its cross-sectional profile, while in an orthogonal direction the cross-sectional dimension may be, for example, about 30 mm. Generally, the ratio of dimensions in a cross-section of such linear beam, as measured in two substantially orthogonal directions, is at least 10.

The use of a line-shaped beam to scan the master holographic plate enables a significant reduction of the stabilization time (such as the time required for mechanical vibrations and motions of index-matching fluid to disappear) by, for example, at least an order of magnitude. The exposure time for any given area of the film is limited by the power density of the beam used in recording. While the total energy required for the exposure does not change, by expanding the conventional beam with a 2D-crossection to a beam with a line-cross-section, the irradiance associated with such beam is increased and the exposure time required for each unit area of the film is accordingly reduced. The line-shaped beam can be rapidly scanned across the exposure area with much less settling time, thereby reducing the greatest constraint on the speed of the holographic replicator system. This also effectuates a fully continuous replication process where a master holographic plate and a recording film that is being exposed to light are pulled across a stationary laser beam substantially without the need to allow for settling time (which otherwise takes on the order of ten seconds in a case when a system does not employ a light source with a line-beam).

Figure 3:
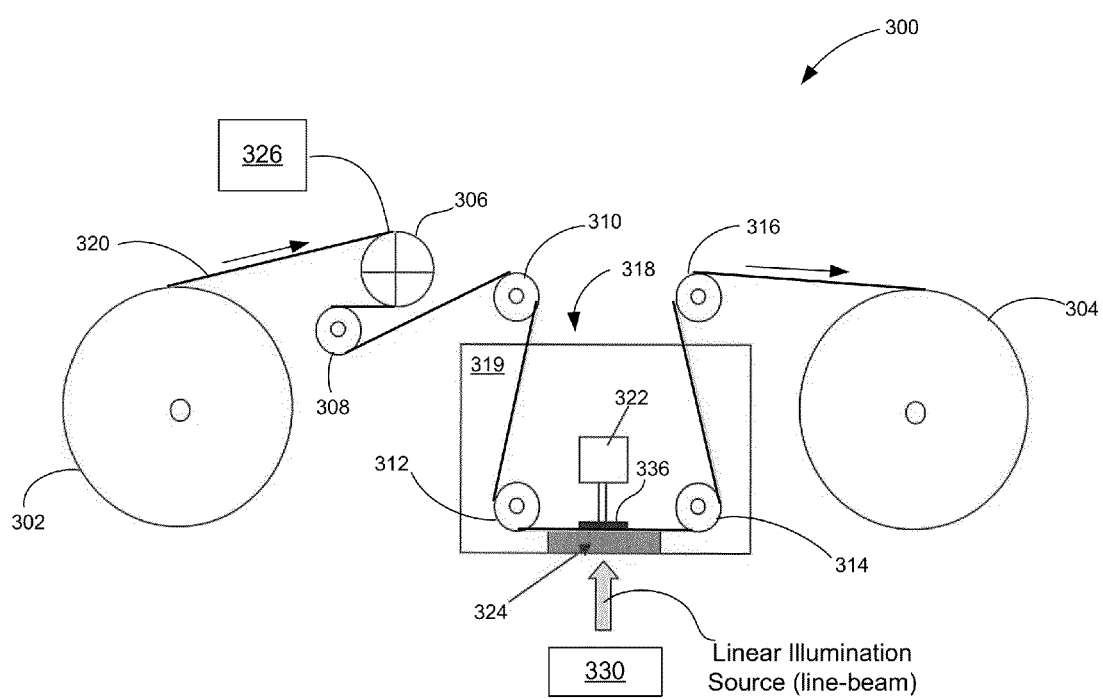
FIG. 3 is a schematic diagram of an embodiment of the holographic replicator system.
Figure 4A:
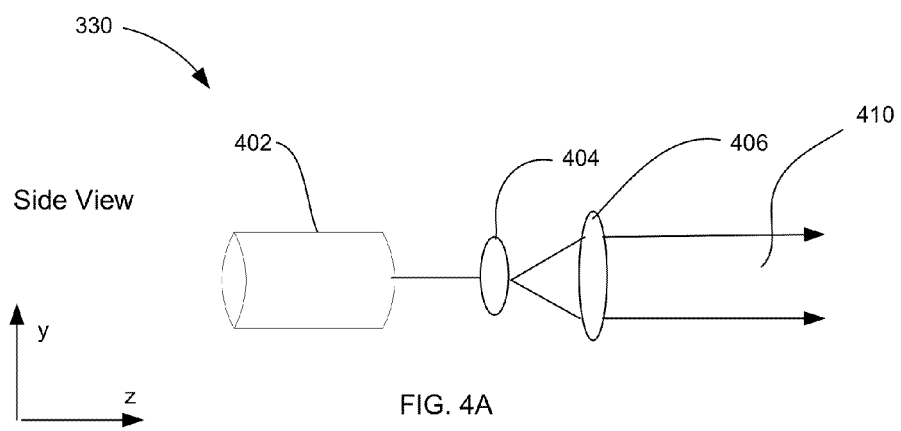
FIG. 4A is a first view of an embodiment of the linear illumination source.
Figure 4B:
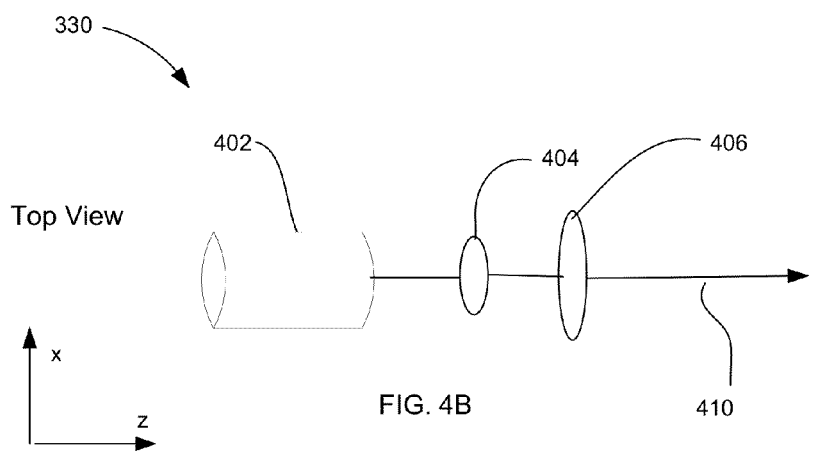
FIG. 4B is a second view of an embodiment of the linear illumination source.
Figure 4C:
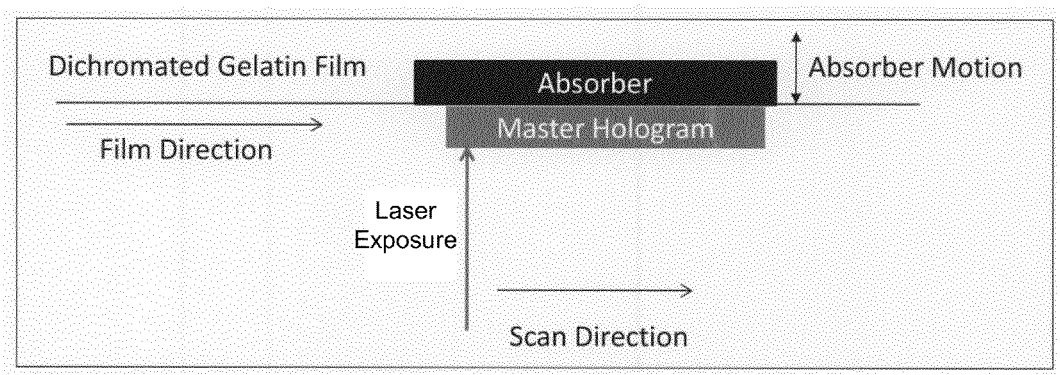
FIG. 4C is a first diagram of Applicants' coherent illumination source irradiating the holographic master plate.
Figure 4D:
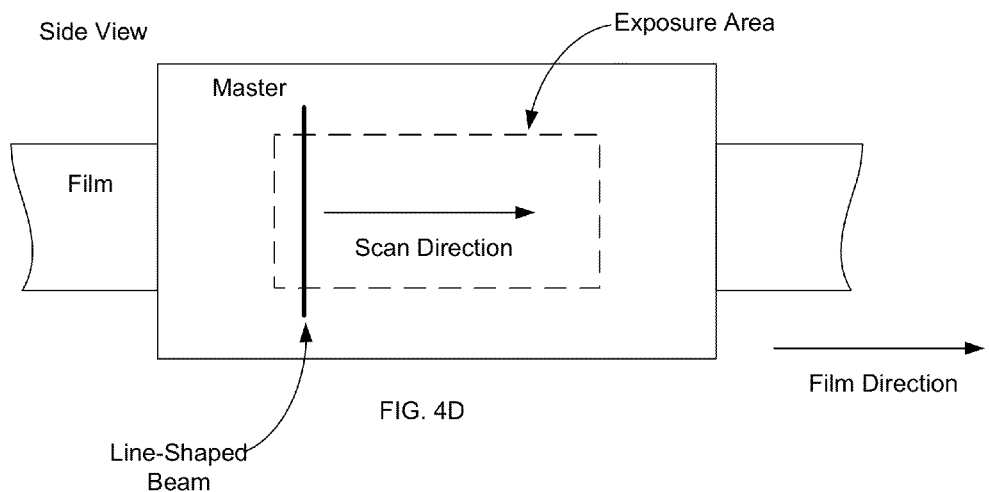
FIG. 4D is a second diagram of Applicants' coherent illumination source irradiating the holographic master plate.

Turning now to FIG. 3, a schematic of one embodiment of the holographic replicator 300 employing a coherent source of illumination 330 is presented. The holographic replicator 300 additionally includes an imaging tank 318. Two diagrams of illumination source 330 are provided in FIGS. 4A and 4B and two diagrams illustrating the irradiation of the holographic master plate with the use of the illumination source 330 are depicted in FIGS. 4C and 4D. In reference to FIG. 4(A,B) and in further reference to FIG. 3, the illumination source 330 includes a laser source 402. Light emitted from the illumination source 330 is expanded in one dimension (for example, y-dimension) with the use of an expansion optical element 404 and then collimated by collimation optical element 406, thereby forming the resulting beam 410 with a line profile. The beam 410 is further used to irradiate the master holographic plate.

Turning back to FIG. 3, the imaging tank 318 contains an actuatable (movable and/or repositionable) absorber 322 and a holographic master plate 324 that, in a specific embodiment, includes an optically transparent plate. In certain embodiments, the actuatable absorber 322 may be actuated pneumatically, hydraulically, mechanically, electrically, or by other suitable means. The holographic master plate 324 may include a glass substrate supporting a film having the master hologram recorded thereon. In one embodiment, the holographic master plate 324 additionally contains a cover layer disposed over the film. Alternatively or in addition, the holographic master plate 324 may include a film having the master hologram recorder thereon, which film is fixatedly attached to a glass substrate.

When in use, the imaging tank 318 contains indexing fluid 319. As will be appreciated by one of ordinary skill in the art, the unwanted interference patterns can be produced by light generated by the illumination source 330, which has reflected from an interface separating media having different refractive indices. The interference pattern can be suppressed with ordinary, uncoated glass by excluding the air gap between the film and the glass, for example by filling any gap space with an index-matching fluid (that has substantially the same refractive index as gelatin and/or glass, for example on the order of n=1.5). A number of fluids can be used, including, but not limited to, glycerol, liquid paraffin, carbon tetrachloride, xylenes, and trichloroethylene.

The holographic replicator 300 further includes a series of rollers which, in operation, advance the recording film 320 through the imaging tank 318 and keep the film 320 under constant tension. In the embodiment 300 of FIG. 3, the holographic replicator 300 is depicted as including an unwind roller 302, an advancement roller 306, a windup roller 304, and an advancement motor 326. The advancement motor 326 powers the advancement roller 306 such that, as advancement roller 306 rotates, the recording film 320 wound around the unwind roller 302 is advanced through the imaging tank 318 and rewound on the windup roller 304. In certain embodiments, the unwind roller 302 and windup roller 304 are independently powered. In a related embodiment, one or both of the unwind roller 302 and the windup roller 304 are powered by advancement motor 326.

The holographic replicator 300 may further additionally include one or more support rollers to aid in feeding the recording film to the holographic master plate. As illustrated in FIG. 3, at least the support rollers 308, 310, 312, 314, and 316 are used, wherein support rollers 312 and 314 are physically located inside the imaging tank 318. In a related embodiments, a bigger or smaller number of the support rollers is employed.

Once the film 320 is inside the imaging tank 318, the support rollers 312 and 314 assist in positioning the recording film 320 between the master plate 324 and the component 336 of the actuatable absorber 322, and maintain mechanical tension of the recording film 320.

While the surface tension of indexing fluid 319 can be relied upon to hold the recording film 320 in close contact with the holographic master plate 324, the movement of the recording film 320 through the imaging tank 318 creates turbulence in the indexing fluid 319, which turbulence can cause the film to shift relative to the master plate thereby corrupting the quality of the hologram-reproduction process. When employing the hologram-replicating systems of the relate art, significant time must be allotted to allow the system/indexing fluid to sufficiently stabilize after each step-advancement of the film 320 through the system before the reproduction of the hologram can be commenced. In contradistinction with the related art, however, use of actuatable absorber 322 of the invention substantially reduces the stabilization time by locking the recording film 320 between the master plate 324 and the absorber 322.

Figure 5:
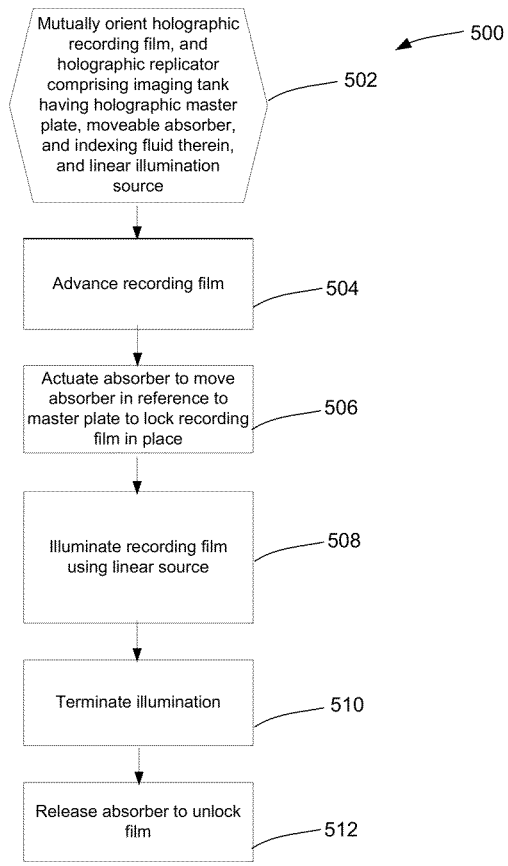
FIG. 5 is a flowchart depicting an example of method for replication of a hologram with the use of the embodiment of FIG. 3.

Turning now to FIG. 5, a flow chart is presented illustrating a method 500 for replicating a hologram with the use of a replicator of the invention. As is indicated at step 502 a holographic replicator of the invention comprising an imaging tank with a holographic master plate and an actuatable absorber and indexing fluid therein, and a linear illumination source is provided along with the holographic recording film. As will be appreciated by one of ordinary skill in the art, an embodiment of the holographic replicator should be preferably operated in a controlled environment, where at least temperature and humidity can be controlled to optimize the imaging process.

At steps 504 and 506, the recording film is advanced to the desired position with respect to the master plate and the absorber is actuated to lock the film between the master plate and the absorber. (Alternatively or in addition, it is the master plate that can be configured to be actuatable in reference to the film, in which case it is the repositioning of the master plate will lock the films between the master plate and the absorber.) The linear light source is then switched on to produce a beam having a line-shaped profile that is scanned across the holographic master plate, creating a replica of the master hologram at the film, at step 508. In certain embodiments, the linear light source can be moved to effectuate the movement of the line-shaped beam across the exposure area of the recording film, for example in a temporally-linear fashion. In a related embodiment, the holographic master plate can be moved instead to achieve the same result. Having exposed the film to the reference and information beam incident onto the film from the master plate for a predetermined time, the exposure is terminated at step 510.

As will be appreciated by one of ordinary skill in the art, the exposure time that is appropriate for holographic exposure may vary and depends on the exposure area, the total exposure energy required, the irradiance and size of the beam. Depending on the recording medium, spectral content of the line-beam and environmental factors, exposure energies can vary from just a few millijoules to hundreds of millijoules.

Finally, as is indicated at step 512, the film-locking component (the actuatable absorber or the actuatable master plate) is released. The described process is repeatable.

In certain embodiments, the individual steps recited in FIG. 5 may be combined, eliminated, or reordered.

It is appreciated that embodiments of the invention may additionally include a specifically dedicated computer readable program code residing in a non-transitory computer readable medium of a computing device that is external or internal to the holographic replicator. In such embodiments, the computing device further comprises a processor, in communication with the holographic replicator, and which, when programmed with the specifically dedicated computer readable program code, executes one or more of the steps recited in the embodiment 500. In such an embodiment, the computer readable program code may be encoded in computer readable medium comprising, for example, a magnetic information storage medium, an optical information storage medium, an electronic information storage medium, and the like. By "electronic storage media," Applicants mean, for example and without limitation, one or more devices, such as and without limitation, a PROM, EPROM, EEPROM, Flash PROM, compactflash, smartmedia, and the like.

While the preferred embodiments of the present invention have been illustrated in detail, it should be apparent that modifications and adaptations to those embodiments may occur to one skilled in the art without departing from the scope of the present invention. For example, in reference to FIG. 3, an optically transmitting window (such as an optical plate) can be used in place of the holographic master plate 324. In contradistinction with the holographic master plate, the window is not configured to generate a secondary diffracted beam from the incident beam traversing the window, and instead simply transmits the incident beam. In such a case, the recordation of the predetermined hologram is effectuated by transmitting two mutually coherent line-beams (a reference beam and an information beam) from the linear source of light through the window onto the recording film that is locked between the light absorber 322 and the window.

The invention claimed is:

1. A hologram replicator comprising:
   an optically transparent plate having top and bottom surfaces substantially parallel to one another;
   a recording film enabled to advance with respect to the top surface of the optically transparent plate; and
   a light absorber actuatable to move substantially transversely to the recording film such as to press the recording film against the optically transparent plate to lock said film between and in contact with the absorber and the optically transparent plate.

2. A replicator according to claim 1, wherein said optically transparent plate includes a holographic master plate forming a diffracted beam from an incident beam of light that is transmitted from outside of the optically transparent plate substantially perpendicularly to and through the bottom surface through said holographic master plate and through the top surface to impinge on the light absorber.

3. A replicator according to claim 1, further comprising a light source configured to generate a light beam having a substantially linear cross-section that is directed to impinge onto the recording film after being transmitted through the top and bottom surfaces through the optically transparent plate.

4. A replicator according to claim 3, where said substantially linear cross-section has first and second dimensions a ratio of which, as measured in two directions that are substantially perpendicular to one another, is at least 10.

5. A replicator according to claim 1, further comprising
   a volume of index-matching liquid submerging the optically transparent plate, the recording film, and the light absorber, and
   a means for pulling the recording film through said volume such as to reposition the film with respect to the optically transparent plate.

6. A replicator according to claim 1, further comprising
   a processor; and
   a computer readable tangible non-transitory medium comprising a computer-readable program code such that, when the code is executed by the processor, the code causes the processor to change a relative positioning of the optically transparent plate and the light absorber such as to lock the recording film therebetween.

7. A method for replicating a hologram, the method comprising:
   locking a recording film enabled to be moved with respect to an optically transparent plate, between said optically transparent plate and a light absorber;
   receiving a reference beam of light and an information beam of light from the optically transparent plate at said recording film, each of said beams being incident onto said recording film from the same side of said recording film, each of said beams of light having a corresponding cross-section with a first dimension that is at least an order of magnitude larger than a second dimension, said first and second dimensions measured in said cross-section in two substantially orthogonal directions; and
   unlocking said recording film to enable an advancement of the film with respect to the optically transparent plate.

8. A method according to claim 7, wherein said locking includes changing mutual positioning of the optically transparent plate and the light absorber.

9. A method according to claim 7, wherein said receiving includes transmitting said reference and information beams of light through the optically transparent plate.

10. A method according to claim 7, wherein said receiving includes forming an information beam of light at the optically transparent plate by transmitting the reference beam through the optically transparent plate towards the recording film.

11. A method according to claim 7, wherein said locking includes locking the recording film submerged in an index matching fluid.

* * * * *